(12) United States Patent
Hung et al.

(10) Patent No.: US 8,723,538 B2
(45) Date of Patent: May 13, 2014

(54) PROBE HEAD FORMATION METHODS EMPLOYING GUIDE PLATE RAISING ASSEMBLY MECHANISM

(75) Inventors: Wensen Hung, Zhubei (TW); Yung-Hsin Kuo, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 332 days.

(21) Appl. No.: 13/163,288

(22) Filed: Jun. 17, 2011

(65) Prior Publication Data

US 2012/0319711 A1    Dec. 20, 2012

(51) Int. Cl.
*G01R 31/00*    (2006.01)

(52) U.S. Cl.
USPC ............ 324/750.16; 324/755.11; 324/750.19; 324/750.22; 324/750.25

(58) Field of Classification Search
USPC ............................. 324/750.16–750.19, 750.2, 324/750.22–750.25, 754.03–754.15, 324/755.05–755.07, 756.01, 756.04, 756.05
See application file for complete search history.

(56) References Cited

U.S. PATENT DOCUMENTS

| | | | |
|---|---|---|---|
| 3,806,801 A | 4/1974 | Bove | |
| 6,297,657 B1 | 10/2001 | Thiessen et al. | |
| 6,356,090 B2 * | 3/2002 | Deshayes | 324/756.03 |
| 6,404,211 B2 | 6/2002 | Hamel et al. | |
| 7,400,156 B2 | 7/2008 | Wu et al. | |
| 2006/0125501 A1 * | 6/2006 | Liu et al. | 324/758 |
| 2010/0308855 A1 * | 12/2010 | Pagani | 324/756.03 |

OTHER PUBLICATIONS

Mialhe, L., et al., "Cobra FP Probe Card for Multi-DUT Logic & Memory Applications," 2005 Southwest Test Workshop, Jun. 6, 2005, Kulicke & Soffa, 22 pgs.

"Micro-Probe's Apollo™ Vertical Probe Card," Presented by Stephen G. Hopkins, Micro-Probe, Inc., Jun. 4, 2001, 27 pgs.

* cited by examiner

*Primary Examiner* — Arleen M Vazquez
*Assistant Examiner* — Son Le
(74) *Attorney, Agent, or Firm* — Slater and Matsil, L.L.P.

(57) ABSTRACT

An assembly includes a lower guide plate having a first plurality of through-holes therein, and an upper guide plate over the lower guide plate. The upper guide plate includes a second plurality of through-holes therein. The assembly further includes a plurality of probe pins. Each of the probe pins is inserted through one of the first plurality of through-holes and one of the second plurality of through-holes. The assembly further includes a plurality of probe pin stoppers, each attached to one of the probe pins, wherein the plurality of probe pin stoppers has lateral sizes greater than lateral sizes of the second plurality of through-holes. The plurality of probe pin stoppers is located over the upper guide plate.

16 Claims, 17 Drawing Sheets

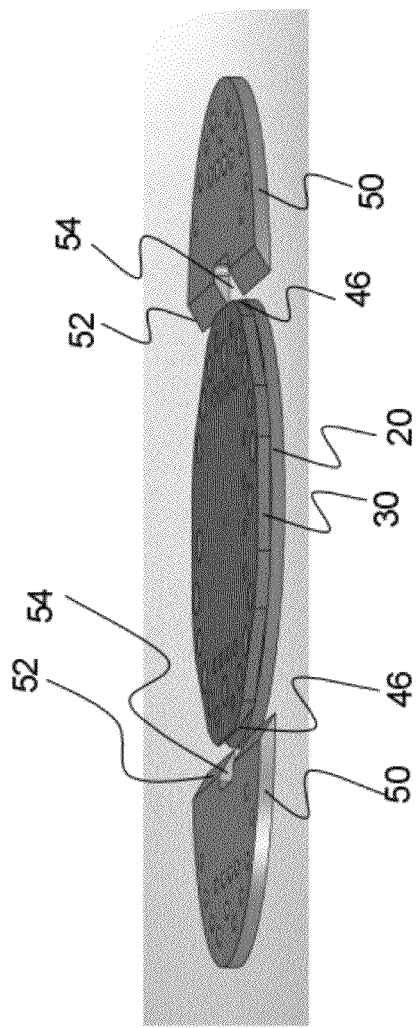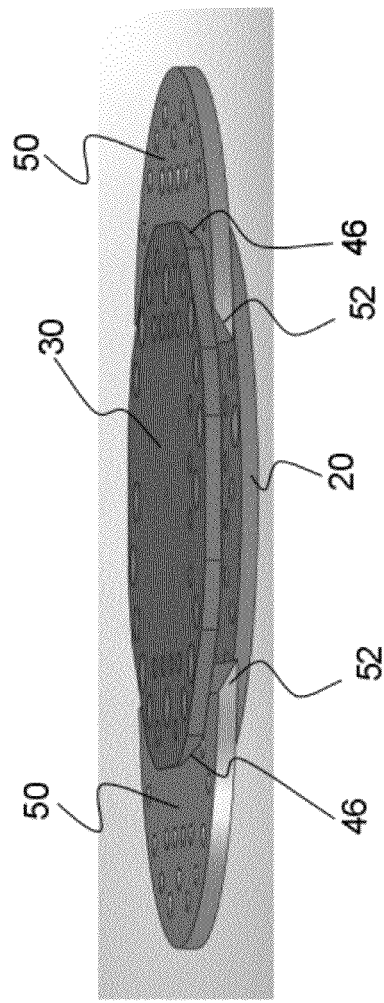
Fig. 8B
Fig. 8C

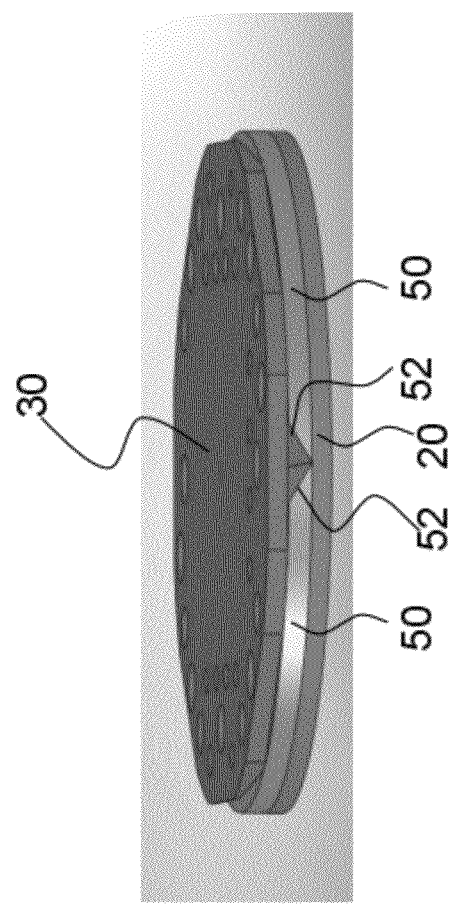

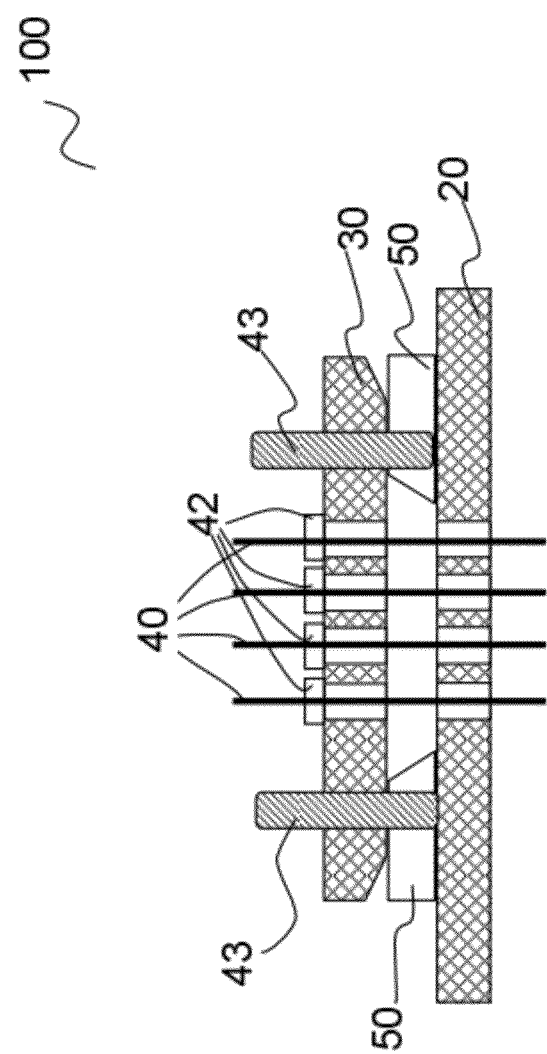

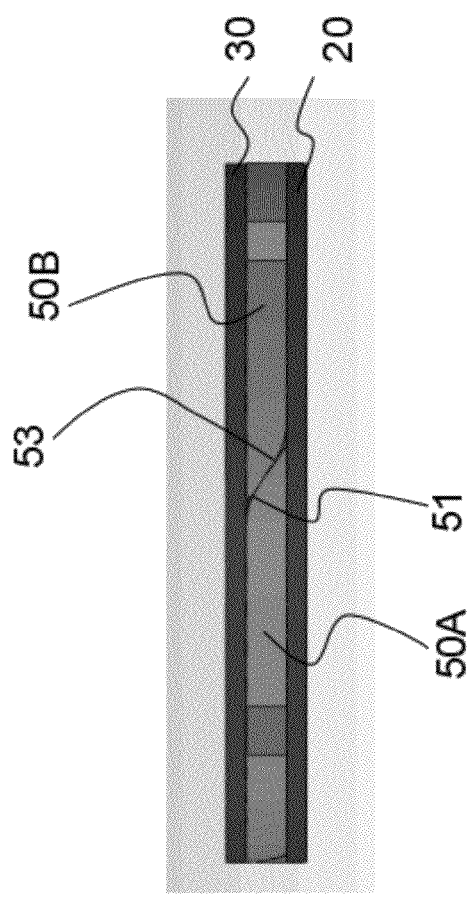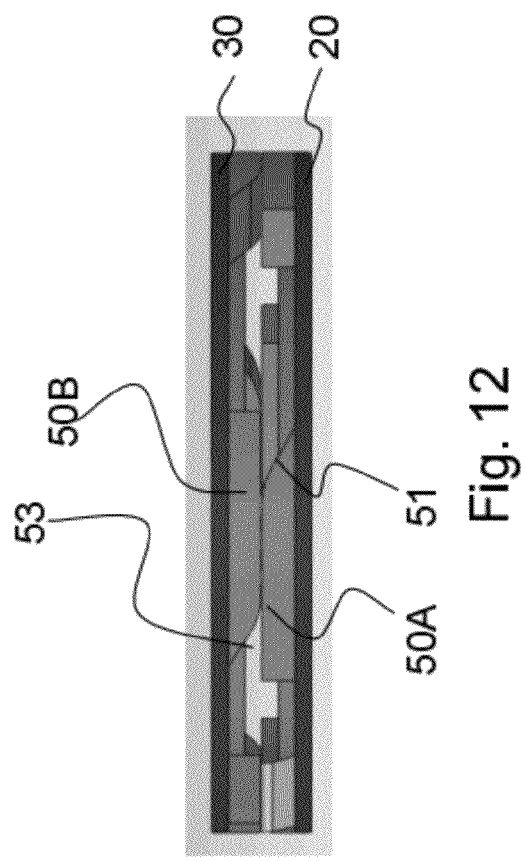

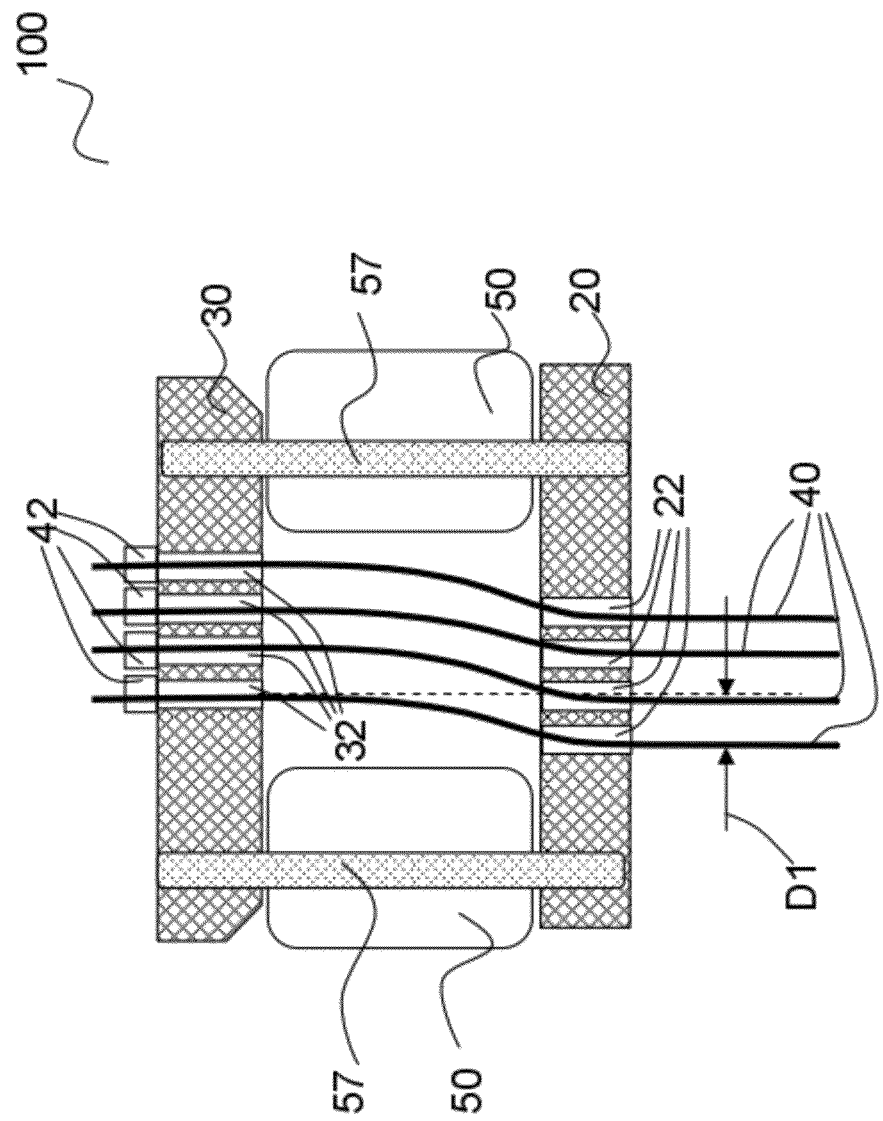

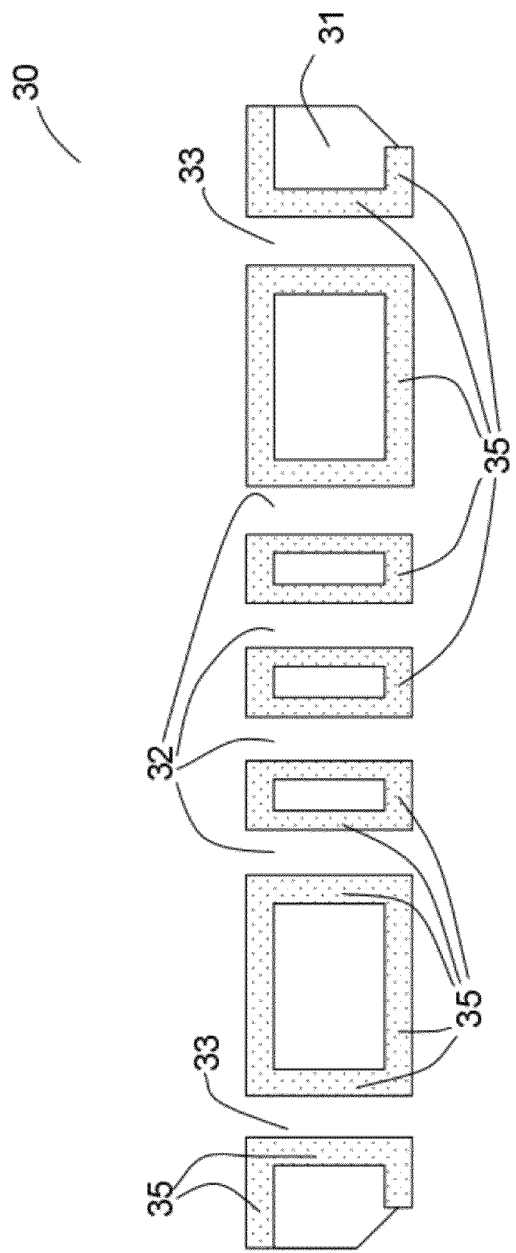
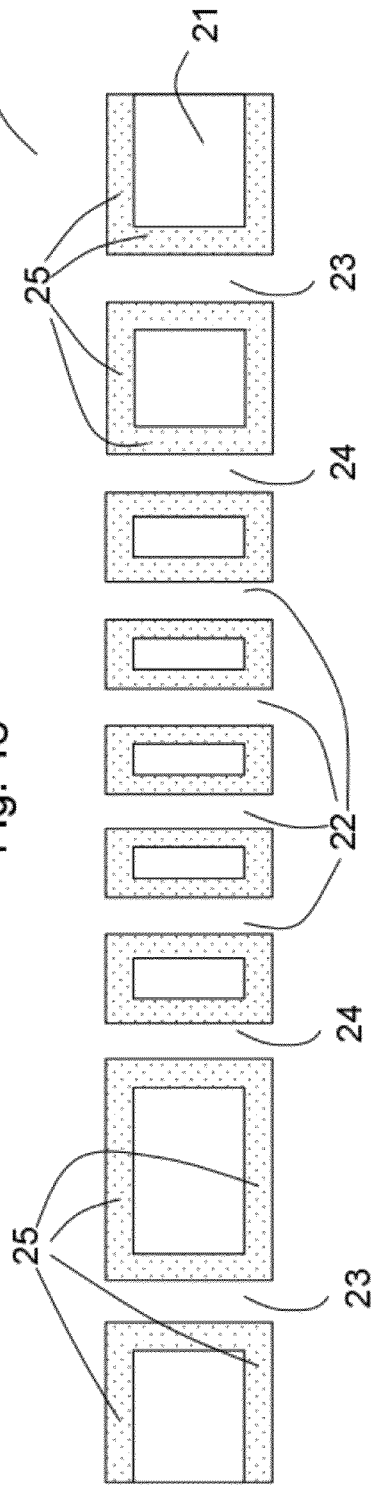
Fig. 16
Fig. 17

PROBE HEAD FORMATION METHODS EMPLOYING GUIDE PLATE RAISING ASSEMBLY MECHANISM

BACKGROUND

During various stages in the manufacturing of integrated circuits, the integrated circuits need to be tested to verify the quality. The testing of the integrated circuits may be performed by using probe cards to probe the contact pads or metal bumps on the surfaces of wafers or chips.

The pitches of the contact pads become increasingly smaller. For example, peripheral pads that are formed at the peripherals of chips have reached as small as about 40 μm. For pad arrays, the pitches also reached as small as about 130 μm. The 40 μm pitch of the contact pads also requires the pitch of the probe pins in the corresponding probe card to be 40 μm. This posts a problem for assembling the probe heads having the small pitch probe pins.

In a conventional probe head assembling process, holes are first drilled in a upper guide plate and a lower guide plate. Probe pins are inserted into the holes in the lower guide plate, and then inserted into a film, which is used for fixing the spacing between the probe pins. After all probe pins are inserted into the film, the probe pins are inserted into the holes in the upper guide plate. Each of the probe pins may have a middle portion, which is located between the portion of the probe pin that is inserted into the upper guide plate and the portion of the probe pin that is inserted into the lower guide plate. The middle portion may have a slightly flattened shape.

There are various issues observed in the formation of the conventional probe heads. For example, the insertion of the probe pins into the upper and lower guide plates were often handled manually. When handling very thin probe pins, for example, with diameters ranging from 1 mil to 4 mils, the probe pins are prone to damage easily. In addition, it is difficult to drill holes in the upper and lower guide plates having pitches as small as about 40 μm. The upper and lower guide plates may be damaged by the drilling process. Particularly, when drilling the holes in the upper guide plates, the material between the holes may be ripped apart. Accordingly, when the pitches of the probe pins are reduced to close to 40 μm, the assembly of the respective probe heads has a low manufacturing yield.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 7 through 9 illustrate cross-sectional views and perspective views of intermediate stages in an assembly process of a probe head in accordance with alternative embodiments, wherein a lower guide plate and an upper guide plate are spaced apart from each by inserting spacers having bevels;

FIGS. 10 through 12 illustrate cross-sectional views and a perspective view of intermediate stages in an assembly process of a probe head in accordance with alternative embodiments, wherein a lower guide plate and an upper guide plate are spaced apart from each by counter rotating an upper spacer and a lower spacer;

FIG. 13 illustrates a probe head, wherein the through-holes in a lower guide plate are misaligned to the respective through-holes in an upper guide plate;

FIG. 16 illustrates a cross-sectional view of exemplary upper guide plate 30 comprising a silicon substrate, and dielectric layers formed on the silicon substrate; and FIG. 17 illustrates the cross-sectional view of exemplary lower guide plate 20 comprising a silicon substrate, and dielectric layers formed on the silicon substrate.

DETAILED DESCRIPTION OF ILLUSTRATIVE EMBODIMENTS

Figure 1:
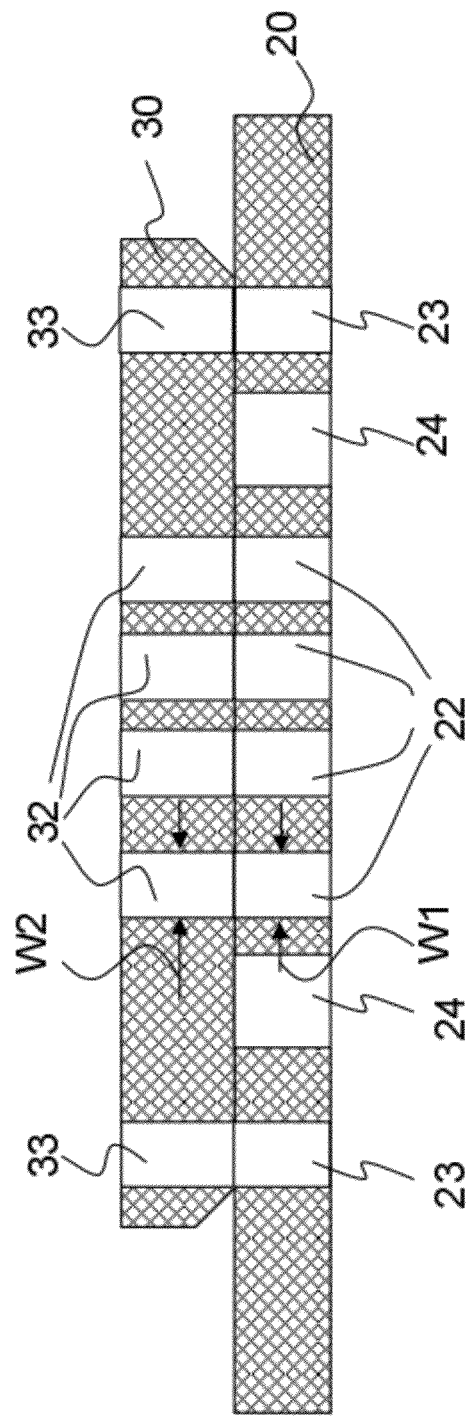
FIGS. 1 through 6 illustrate cross-sectional views and perspective views of intermediate stages in an assembly process of a probe head in accordance with an embodiment, wherein a lower guide plate and an upper guide plate are spaced apart from each other using a raising jig.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A probe head structure and the method of forming the same are provided in accordance with an embodiment. The intermediate stages of manufacturing various embodiments are illustrated. The variations and the operation of the embodiment are then discussed. Throughout the various views and illustrative embodiments, like reference numbers are used to designate like elements.

FIGS. 1 through 6 illustrate cross-sectional views and perspective views in the assembly process of a probe head in accordance with an embodiment. Upper guide plate 30 is stacked over lower guide plate 20. Through-holes 22 are formed in lower guide plate 20, and through-holes 32 are formed in upper guide plate 30. The formation of through-holes 22 and 32 may include drilling or other applicable methods. Through-holes 22 and 32 are vertically aligned with a one-to-one correspondence. The lateral size W1 (such as dimension) of through-holes 22 may be equal to, or different from, lateral size W2 of through-holes 32. Through-holes 22 and 32 are arranged according to the patterns of the contact pads of the device-under-test (DUT, not shown) with a one-to-one correspondence, so that the probe head may be used to probe the DUT. In an embodiment, through-holes 22 and 32 are arranged as an array, although other patterns may be used, depending on the pattern of the DUT. Upper guide plate 30 and lower guide plate 20 further includes through-holes 23 and 33, respectively, wherein raising guide pins 43 (not shown in FIG. 1, please refer to FIG. 3) may be inserted into through-holes 23 and 33. Lower guide plate 20 may further includes a plurality of lifting holes 24.

Upper guide plate 30 and lower guide plate 20 may be formed of a dielectric material such as ceramic, vespel, engineering plastic, and the like. Alternatively, as shown in FIG. 16, upper guide plate 30 may be formed starting from silicon substrate 31. Holes 32 and 33 are formed in silicon substrate 31, for example, through etching or drilling. An isolation process may then be performed to form dielectric layers 35 on the exposed surfaces of silicon substrate 31, wherein dielectric layers 35 extend into holes 32 and 33. The isolation process may comprise, for example, an oxidation process, so that a surface layer of silicon substrate 31 is oxidized to form dielectric layers 35. Furthermore, deposition processes such as chemical vapor deposition (CVD) and plasma enhanced chemical vapor deposition (PECVD) may be used to form dielectric layers 35.

Similarly, as shown in FIG. 17, lower guide plate 20 may be formed starting from silicon substrate 21. Holes 22, 23, and 24 are formed in silicon substrate 21, for example, using through etching or drilling. Dielectric layers 25 may be formed using essentially the same method as forming dielectric layers 35 as in FIG. 16. Each of upper guide plate 30 and lower guide plate 20 may also comprise a plurality of identical plates, which are bonded together to form the respective upper guide plate 30 and lower guide plate 20.

Figure 2A:
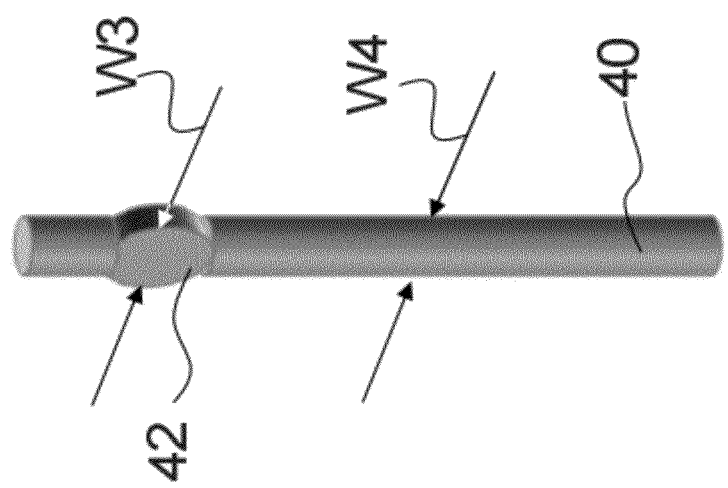
Figure 2B:
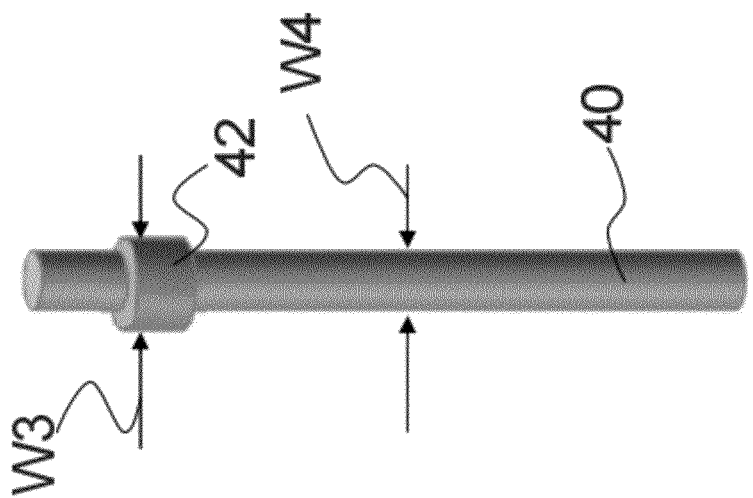
Figure 2C:
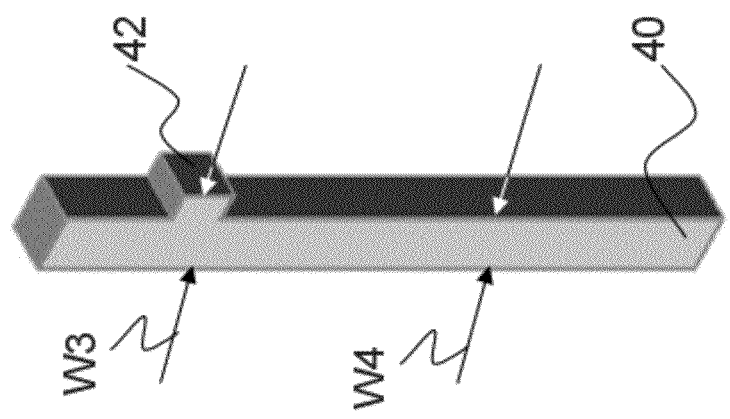

FIGS. 2A, 2B, and 2C illustrate perspective views of probe pins 40 in accordance with various embodiments. Probe pins 40 are formed of conductive materials such as metals. Each of probe pins 40 as shown in FIGS. 2A, 2B, and 2C is attached with one probe pin stopper 42, which has lateral size W3 greater than later size W4 of the respective probe pin 40. In FIG. 2A, probe pin stopper 42 may be coated on probe pin 40, and may be formed of a conductive or a dielectric material. In FIG. 2B, probe pin stopper 42 is a compressed portion of probe pin 40, and hence is formed of a same material as probe pin 40. In FIGS. 2A and 2B, probe pins 40 may have circular cross-sectional views. In FIG. 2C, probe pin 40 may have a rectangular (such as a square) cross-sectional view (a top view or a bottom view), and probe pin stopper 42 may be plated on probe pin 40. In an embodiment, an entirety (except the portion on which probe pin stopper 42 is formed or attached) of one probe pin 40 has a uniform lateral dimension W4 and a uniform cross-sectional shape. In other embodiments, different portions of probe pin 40 may have different lateral dimensions.

Figure 3:
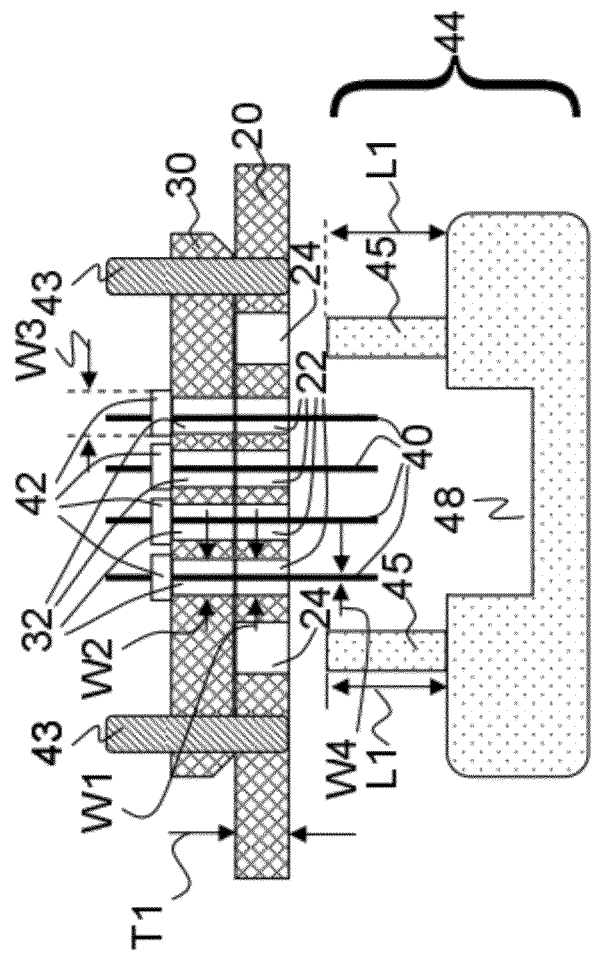

Referring to FIG. 3, raising guide pins 43 are inserted into through-holes 23 and 33 (FIG. 1), so that through-holes 22 are aligned to the respective through-holes 32. Probe pins 40 are inserted into through-holes 32 and 22 from above upper guide plate 30. The lateral sizes W1 and W2 are greater than lateral size W4 of probe pins 40, and are smaller than lateral size W3 of probe pin stoppers 42. Accordingly, probe pins 40 may penetrate through holes 22 and 32, while probe pin stoppers 42 are in contact and blocked by upper guide plate 30. A portion of each of probe pins 40 extends below lower guide plate 20. The lengths of the portions of probe pins 40 extending below lower guide plate 20 may be equal to each other.

FIG. 3 also illustrates raising jig 44, which is used to raise upper guide plate 30. Raising jig 44 includes pins 45, whose positions correspond to the positions of lifting holes 24 (which are through holes) in lower guide plate 20. Length (height) L1 of pins 45 is greater than thickness T1 of lower guide plate 20. Lengths L1 of pins 45 may be the same.

Figure 4:
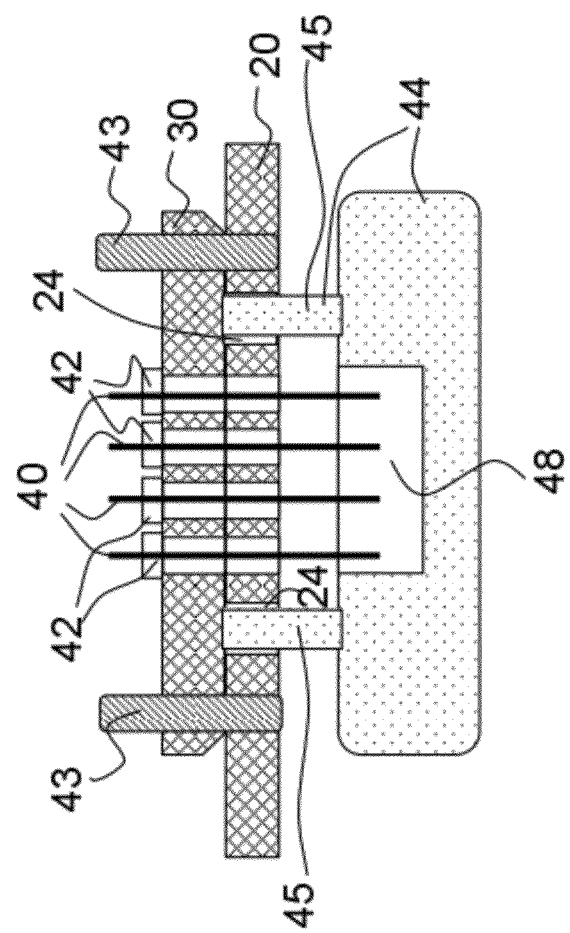
Figure 5:
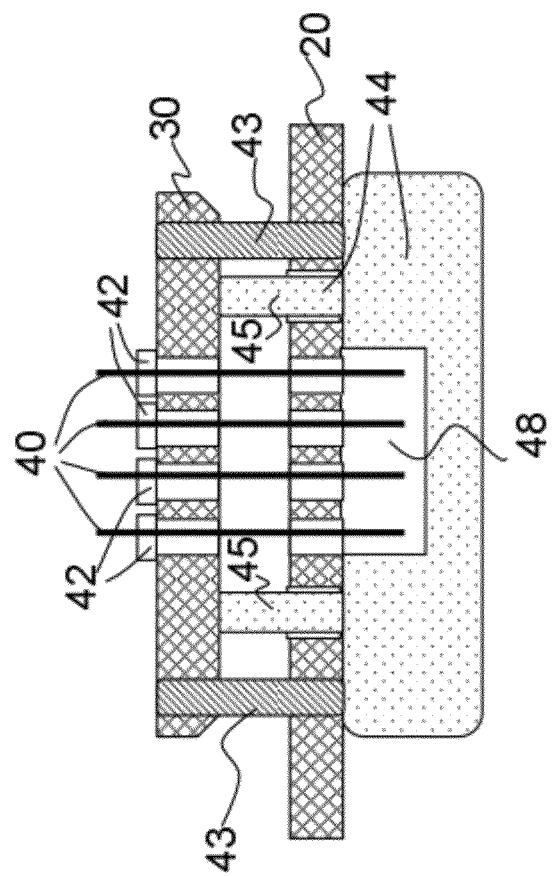

FIG. 4 illustrates the insertion of pins 45 into lower guide plate 20. Raising jig 44 may include recess 48 whose position, size, and depth are configured to hold probe pins 40. Referring to FIG. 5, raising jig 44 is pushed up, which in turn pushes upper guide plate 30, causing upper guide plate 30 and lower guide plate 20 to be separated from each other. During the pushing up of upper guide plate 30, the major surfaces of upper guide plate 30 remain parallel to the major surfaces of lower guide plate 20. Raising guide pins 43 guides the upward movement of upper guide plate 30, so that there is no lateral shift between upper guide plate 30 and lower guide plate 20.

In an embodiment, raising jig 44 is pushed until raising jig 44 is blocked by lower guide plate 20.

Figure 6:
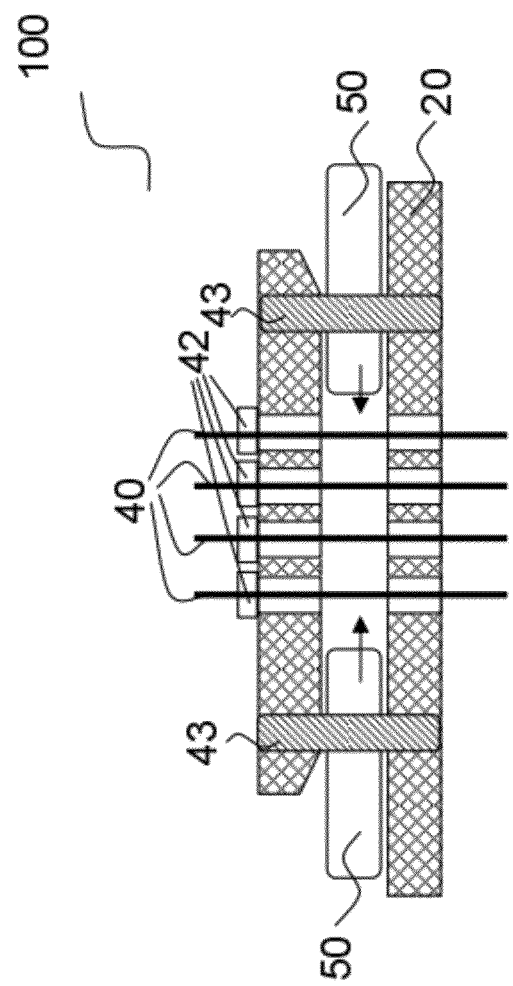

Next, as shown in FIG. 6, spacers 50 are inserted between lower guide plate 20 and upper guide plate 30. In an embodiment, there are two separate spacers 50 inserted from opposite directions (as shown by arrows) toward the space between lower guide plate 20 and upper guide plate 30. In alternative embodiments, there may be three or four spacers 50. Spacers 50 may be formed of a dielectric material, although it may also be formed conductive materials. After spacers 50 are inserted to desirable positions, the relative positions of upper guide plate 30, lower guide plate 20, and spacers 50 may be secured, for example, by using pins, clamps, or the like. Probe head 100 is thus assembled.

Figure 7:
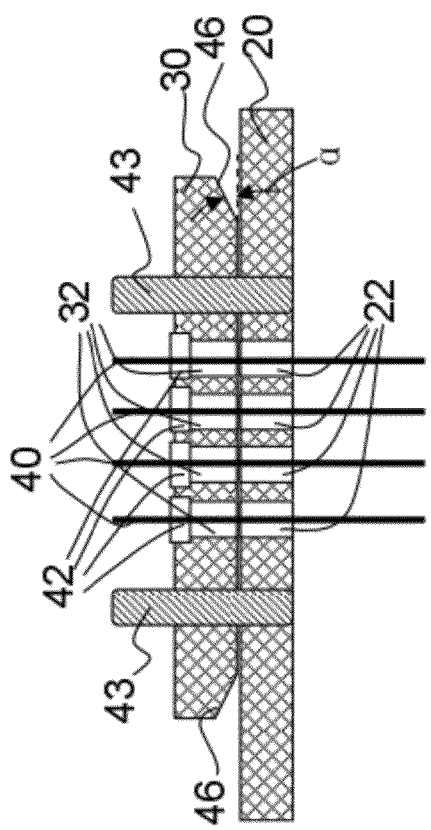

FIGS. 7 through 9 illustrate cross-sectional views and perspective views of a probe head assembly process in accordance with various alternative embodiments. Unless specified otherwise, the reference numerals in these embodiments represent like elements in the embodiments illustrated in FIGS. 1 through 6. Referring to FIG. 7, upper guide plate 30 and lower guide plate 20 are stacked, with through-holes 22 and 32 vertically overlapped. Raising guide pins 43 may be inserted into the through-holes in upper guide plate 30 and lower guide plate 20. Upper guide plate 30 includes bevel(s) 46 that face lower guide plate 20. The slant angle $\alpha$ of bevels 46 may be between about 20 degrees and about 70 degrees, or between about 30 degrees and about 60 degrees, although different angles may be used. Probe pins 40 are inserted into through-holes 22 and 32, until probe pin stoppers 42 are blocked by upper guide plate 30.

Figure 8A:
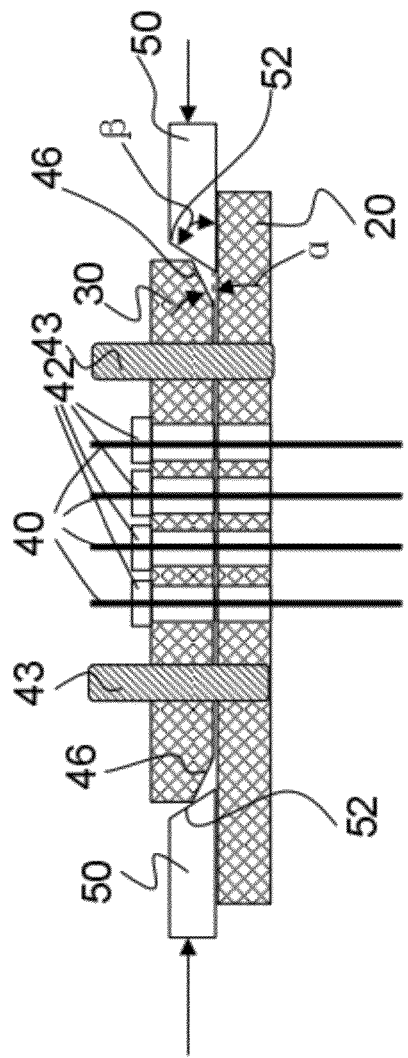

Referring to FIG. 8A, spacers 50 are then inserted in the directions illustrated by arrows, for example, simultaneously. Spacers 50 may have bevels 52, wherein bevels 52 and 46 are tilted in the same directions. Slant angle $\beta$ of bevels 52 may be the same as, or different from, slant angle $\alpha$. The slant angle $\beta$ of bevels 52 may be between about 20 degrees and about 70 degrees, or between about 30 degrees and about 60 degrees, although different angles may be used. With slant bevels 52 and 46, spacers 50 may be pushed under upper guide plate 30. With the proceeding of the insertion of spacers 50, upper guide plate 30 is raised, and hence upper guide plate 30 is spaced apart from lower guide plate 20. The resulting probe head 100 is shown in FIG. 9.

FIGS. 8B, 8C, and 8D illustrate the perspective views of intermediate stages in the insertion of spacers 50. Probe pins 40, although they may have already been assembled with upper guide plate 30 and lower guide plate 20 at the time spacers 50 are inserted, are not shown. Furthermore, through-holes 22 and 32 and guide pins 43 are not illustrated, while they do exist. Though-openings 54 in spacers 50 as shown in FIG. 8B may be used for accommodating probe pins 40. The plurality of holes as shown in upper guide plate 30, lower guide plate 20, and spacers 50 may be used for the insertion of raising guide pins 43, and the pins for securing the assembly after the probe head is assembled. As shown in FIGS. 8B through 8D, with the insertion of spacers 50, upper guide plate 30 is separated from lower guide plate 20, until eventually, spacers 50 are inserted to the desirable locations. For example, spacers 50 may contact each other. Pins (not shown) may then be inserted into the holes.

Figure 10:
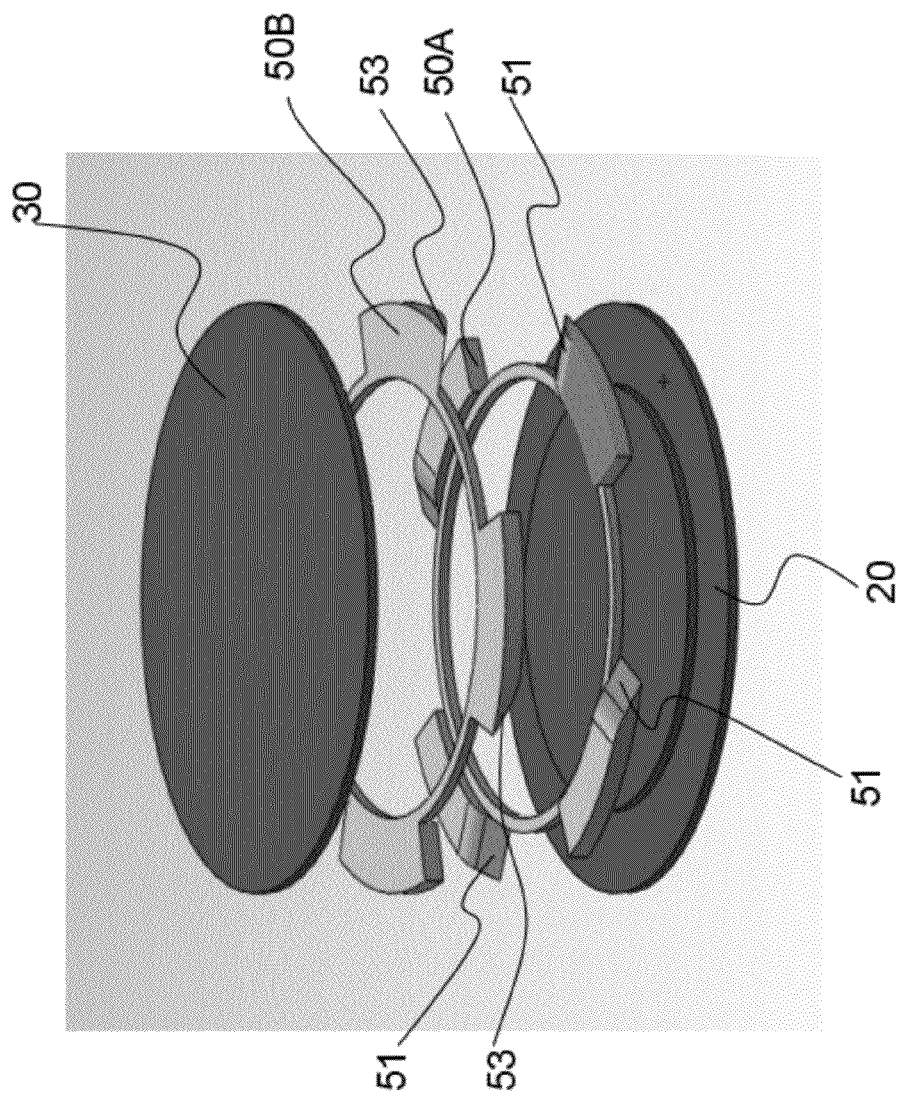

FIGS. 10 through 12 illustrate a perspective view and cross-sectional views of a probe head assembly process in accordance with various alternative embodiments. Probe pins 40, probe pin stoppers 42, and through-holes 22 and 32 are not shown (although they do exist), and the respective details may be essentially the same as in the embodiments shown in FIGS. 1 through 9. In this embodiment, upper rotational spacer 50B and lower rotational spacer 50A are pre-assembled between upper guide plate 30 and lower guide plate 20 before probe pins 40 (please refer to FIG. 3) are inserted. Upper rotational spacer 50B and lower rotational spacer 50A are configured so that when they are rotated to a first position, they may have bottom surfaces level with each other, and top surfaces level each other. When rotational spacers 50A and 50B are rotated to a second position, rotational spacer 50B is stacked on rotational spacer 50A.

Before the insertion of probe pins 40 (FIG. 3B), the cross-sectional view of the probe head may be as in FIG. 11. Probe pins 40 are then inserted and blocked by upper guide plate 30. It is observed that at this time, as shown in FIGS. 10 and 11, bevels 51 of lower rotational spacer 50A and bevels 53 of upper rotational spacer 50 B face each other. Accordingly, as shown in FIG. 11, upper rotational spacer 50B and lower rotational spacer 50A are at a same level, and have the same thickness. The top surfaces of both upper rotational spacer 50B and lower rotational spacer 50A contact upper guide plate 30, and the bottom surfaces of both upper rotational spacer 50B and lower rotational spacer 50A contact lower guide plate 20.

Next, as shown in FIG. 12, upper rotational spacer 50B and lower rotational spacer 50A are counter rotated. In the perspective view as in FIG. 10, upper rotational spacer 50B may be rotated clockwise (in the top view), and lower rotational spacer 50A may be rotated counter clockwise (in the top view). Accordingly, as shown in FIG. 12, upper rotational spacer 50B is stacked over lower rotational spacer 50A, and hence the space between upper guide plate 30 and lower guide plate 20 may be equal to the sum of the thicknesses of rotational spacers 50A and 50B.

FIG. 13 illustrates that through-holes 22 in and upper guide plate 30 and through-holes 22 in lower guide plate 20 are misaligned for deformation control. When probe pins 40 are in contact with probe pads of the DUT (not shown), probe pins 40 may be pushed back by the contact pads. To control the deformation directions of probe pins 40, so that all probe pins 40 bend to the same direction when pushed, one of the upper guide plate 30 and lower guide plate 20 may be shifted laterally to bend probe pins 40. The lateral shift distance is marked as D1 in FIG. 13. The bending of probe pins 40 may prevent probe pins 40 from shorting with each other. The shift in the relative lateral positions of upper guide plate 30 and lower guide plate 20 may be performed after the steps shown in FIGS. 5 and 8A are finished. Additional shift guide pins 57 may then be inserted to maintain the lateral shift. In FIG. 13, although through-holes 22 and 32 are vertically misaligned, through-holes 22 and 32 are still capable of being vertically overlapped, as shown in FIG. 1.

Figure 14:
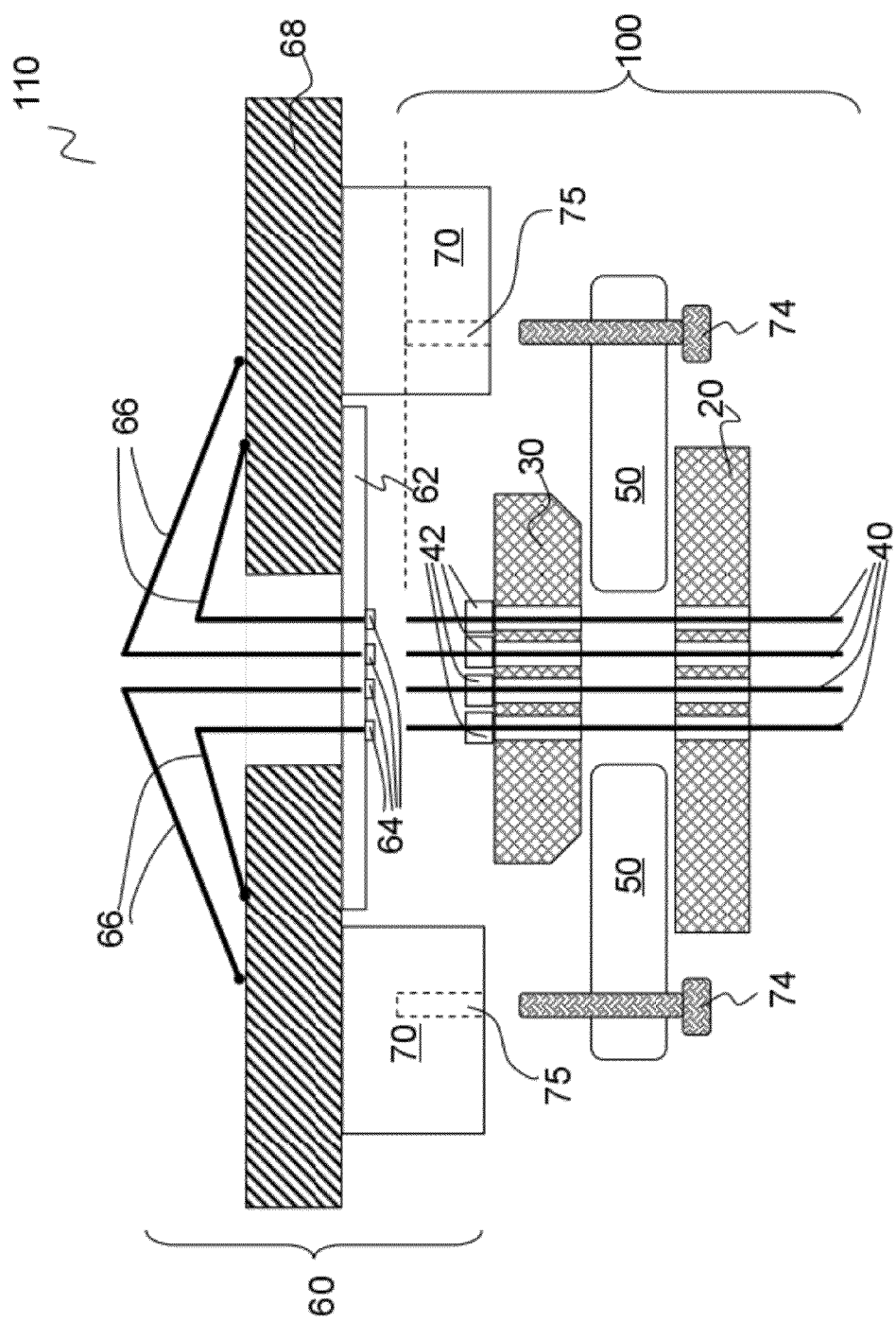
FIG. 14 illustrates a probe card comprising a probe head and a space transformer, wherein the space transformer is used for transforming the pitches of probe pins to greater pitches, and wherein the probe pins are electrically coupled to a printed circuit board (PCB) through wires.

Since the pitches between probe pins 40 are small, probe head 100 may be assembled with space transformer 60. As shown in FIG. 14, wire space transformer 60 is illustrated. Wire space transformer 60 includes space transformer plate 62, which further includes contact pads 64. Contact pads 64 are configured to have the same pitch as probe pins 40, so that they can physically contact probe pins 40 when probe pins 40 are in contact with the contact pads of the DUT (not shown). Accordingly, the contact pads of the DUT have an electrical connection to wires 66, which connect printed circuit board (PCB) 68 to space transformer plate 62. Probe head 100 and space transformer 60 are combined to form probe card 110. Fixing ring 70, which is secured on PCB 68, may be attached with probe head 100 through secure pins 74. Secure pins 74 may be inserted into openings 75 in fixing ring 70.

Figure 15:
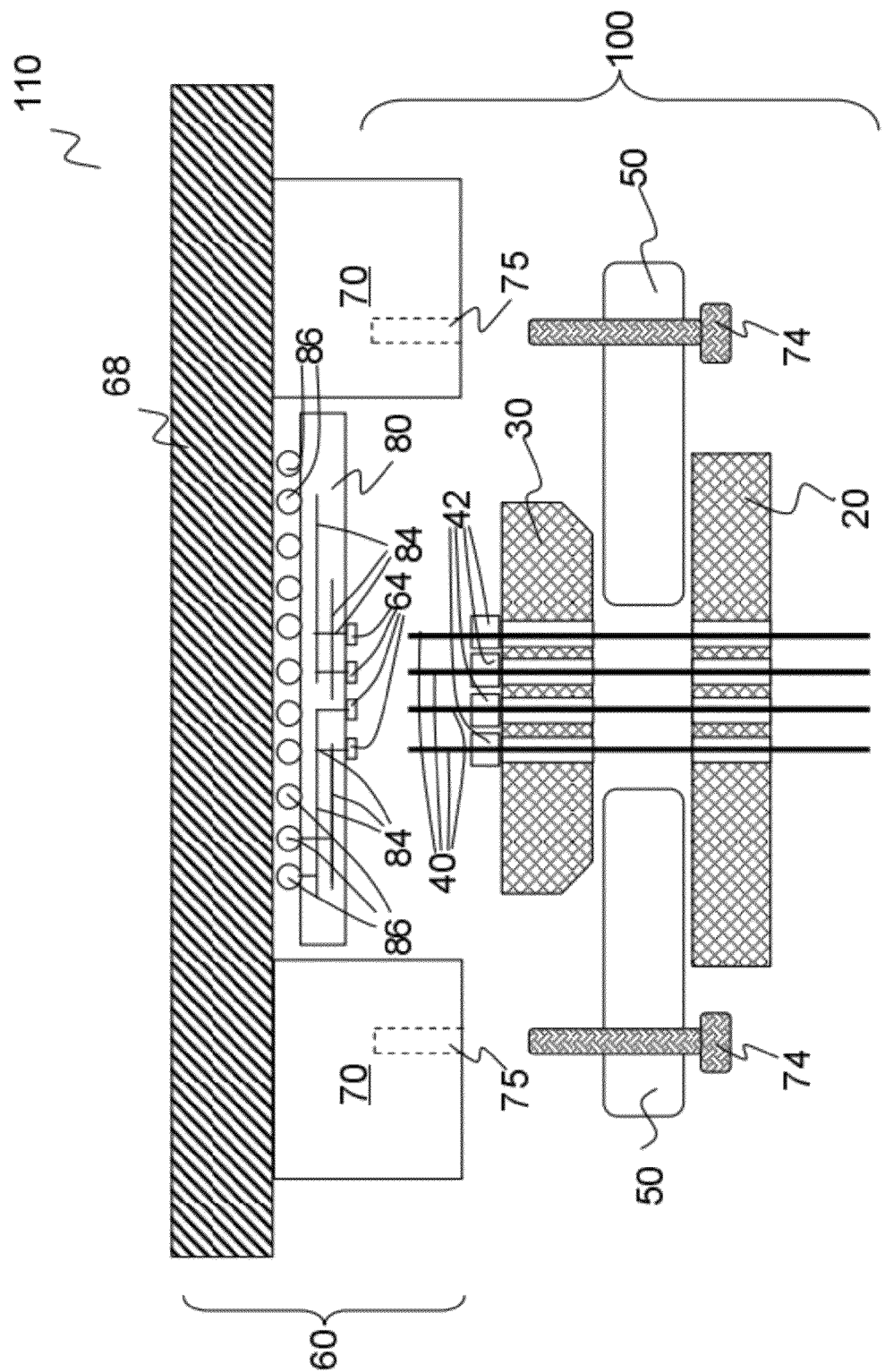
FIG. 15 illustrates a probe card comprising a probe head and a space transformer, wherein the space transformer is used for transforming the pitches of probe pins to greater pitches, and wherein the probe pins are electrically coupled to a PCB through flip-chip bonding through a substrate, which is bonded to the PCB through flip-chip bonding.

FIG. 15 illustrates probe card 110 in accordance with alternative embodiments. This embodiment is similar to what is shown in FIG. 14, except substrate 80 replaces space transformer plate 62. Substrate 80 is bonded to PCB 68 through flip-chip bonding, with solder balls 86 therebetween. Metal lines and vias 84 are formed in substrate 80, so that solder balls 86 may have greater pitches than contact pads 64. Probe pins 40 thus can be electrically connected to PCB 68 through contact pads 64, metal lines and vias 84, and solder balls 86. In the embodiment shown in FIGS. 14 and 15, probe head 100 may adopt the design shown in any of FIGS. 6, 9, 10, and 12.

In the embodiments, an upper guide plate and a lower guide plate are stacked first, with the through-holes aligned, so that the insertion of probe pins is easy. The desirable distance between the upper guide plate and the lower guide plate is set by pushing the upper guide plate and the lower guide plate apart from each other after the insertion of probe pins. Accordingly, the setting of the distance between the upper guide plate and the lower guide plate does not result in the increase in difficulty in the assembly process.

In accordance with embodiments, an assembly includes a lower guide plate having a first plurality of through-holes therein, and an upper guide plate over the lower guide plate. The upper guide plate includes a second plurality of through-holes therein. The assembly further includes a plurality of probe pins. Each of the probe pins is inserted through one of the first plurality of through-holes and one of the second plurality of through-holes. The assembly further includes a plurality of probe pin stoppers, each attached to one of the probe pins, wherein the plurality of probe pin stoppers has lateral sizes greater than lateral sizes of the second plurality of through-holes. The plurality of probe pin stoppers is located over the upper guide plate.

In accordance with other embodiments, an assembly includes a lower guide plate having a first plurality of through-holes therein, and an upper guide plate over the lower guide plate. The upper guide plate includes a second plurality of through-holes therein, wherein the first plurality of through-holes and the second plurality of through-holes are capable of being vertically overlapped simultaneously with a one-to-one correspondence. A plurality of lifting holes is in the lower guide plate, wherein the plurality of lifting holes is through holes. The assembly further includes a plurality of probe pins, wherein each of the plurality of probe pins is inserted through one of the first plurality of through-holes and one of the second plurality of through-holes, and wherein the plurality of probe pins extends below a bottom surface of the lower guide plate. Two spacers are located between, and contacting, the lower guide plate and the upper guide plate, wherein the two spaces are separate pieces.

In accordance with yet other embodiments, a method includes stacking an upper guide plate over a lower guide plate, and aligning a first plurality of through-holes in the upper guide plate to a second plurality of through-holes in a lower guide plate. When the first plurality of through-holes is aligned to the second plurality of through-holes, a plurality of probe pins is inserted into the first and the second plurality of through-holes, wherein each of the probe pins is inserted into one of the first plurality of through-holes and one of the second plurality of through-holes that is aligned to the one of the first plurality of through-holes. After the step of inserting, the upper guide plate is spaced apart from the lower guide plate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An assembly comprising:
  a lower guide plate comprising:
    a first plurality of through-holes therein; and
    a plurality of lifting holes penetrating through the lower guide plate;
  an upper guide plate over the lower guide plate, wherein the upper guide plate comprises a second plurality of through-holes therein;
  two spacers between the lower guide plate and the upper guide plate, wherein the two spacers are rotational spacers having a same thickness, and wherein the two spacers are configured to be rotated to be stacked, and rotated to be at a same level when rotated relative to each other to different positions;
  a plurality of probe pins, wherein each of the probe pins is inserted through one of the first plurality of through-holes and one of the second plurality of through-holes; and
  a plurality of probe pin stoppers, each attached to one of the probe pins, wherein the plurality of probe pin stoppers has lateral sizes greater than lateral sizes of the second plurality of through-holes, and wherein the plurality of probe pin stoppers is located over the upper guide plate.

2. The assembly of claim 1, wherein the assembly further comprises a raising jig comprising a plurality of pins configured to be inserted through the plurality of lifting holes simultaneously, and wherein lengths of portions of the plurality of probe pins below a bottom surface of the lower guide plate is configured to be adjusted in response to lengths of portions of the plurality of pins over a top surface of the lower guide plate.

3. The assembly of claim 2, wherein the raising jig further comprises a recess, wherein the recess faces the lower guide plate when the pins of the raising jig are inserted into the lifting holes of the lower guide plate, and wherein a position and a depth of the recess is configured to hold the plurality of probe pins when the pins of the raising jig are inserted into the lifting holes of the lower guide plate.

4. The assembly of claim 1, wherein each of the first plurality of through-holes is vertically aligned to one of the second plurality of through-holes, and wherein the plurality of probe pins is straight pins.

5. The assembly of claim 1, wherein the first plurality of through-holes is misaligned to the second plurality of through-holes by a lateral distance, and wherein the first and the second plurality of through-holes are capable of being vertically aligned with a one-to-one correspondence.

6. The assembly of claim 1, wherein the upper guide plate comprises a first bevel facing the lower guide plate, and wherein each of the two spacers further comprises a second bevel facing the upper guide plate.

7. The assembly of claim 1 further comprising:
  a space transformer comprising:
    a printed circuit board (PCB); and
    a space transformer plate attached to the PCB, wherein the space transformer plate comprises:
      contact pads facing the plurality probe pins and have same pitches as the plurality of probe pins; and
      wires electrically connecting the PCB to the contact pads.

8. The assembly of claim 1 further comprising:
  a space transformer comprising:
    a PCB;
    a substrate bonded to the PCB through flip-chip bonding, wherein the substrate comprises contact pads facing the plurality of probe pins and have same pitches as the plurality of probe pins; and
    solder balls bonding the PCB to the substrate, wherein the contact pads are electrically coupled to the PCB through the solder balls.

9. An assembly comprising:
  a lower guide plate comprising a first plurality of through-holes therein;
  an upper guide plate over the lower guide plate, wherein the upper guide plate comprises a second plurality of through-holes therein, wherein the first plurality of through-holes and the second plurality of through-holes are capable of being vertically overlapped simultaneously with a one-to-one correspondence;
  a plurality of lifting holes in the lower guide plate, wherein the plurality of lifting holes is through holes;
  a plurality of probe pins, wherein each of the plurality of probe pins is inserted through one of the first plurality of through-holes and one of the second plurality of through-holes, wherein the plurality of probe pins extends below a bottom surface of the lower guide plate, and wherein lengths of portions of the plurality of probe pins below a bottom surface of the lower guide plate are configured to be adjusted in response to lengths of portions of the plurality of pins over a top surface of the lower guide plate;
  two spacers between, and contacting, the lower guide plate and the upper guide plate, wherein the two spaces are separate pieces; and
  a raising jig comprising a plurality of pins configured to be inserted through the plurality of lifting holes simultaneously.

10. The assembly of claim 9 further comprising a plurality of probe pin stoppers, each attached to one of the probe pins, wherein the plurality of probe pin stoppers has lateral sizes greater than lateral sizes of the second plurality of through-holes, and wherein the plurality of probe pin stoppers are located over the upper guide plate.

11. The assembly of claim 9, wherein each of the first plurality of through-holes is horizontally shifted relative to one of the second plurality of through-holes by a lateral distance.

12. The assembly of claim 9, wherein each of the first plurality of through-holes is vertically aligned to one of the second plurality of through-holes, and wherein the plurality of probe pins are straight pins.

13. A method comprising:
  stacking an upper guide plate over a lower guide plate;
  aligning a first plurality of through-holes in the upper guide plate to a second plurality of through-holes in an lower guide plate;
  when the first plurality of through-holes is aligned to the second plurality of through-holes, inserting a plurality of probe pins into the first and the second plurality of through-holes, wherein each of the probe pins is inserted into one of the first plurality of through-holes and one of the second plurality of through-holes that is aligned to the one of the first plurality of through-holes;

after the step of inserting, spacing the upper guide plate apart from the lower guide plate, wherein spacing the upper guide plate apart from the lower guide plate comprises:
- inserting pins of a raising jig into lifting holes in the lower guide plate; and
- pushing up the upper guide plate using the pins of the raising jig; and inserting spacers into a space between the lower guide plate and the upper guide plate.

14. The method of claim 13, wherein bevels of the spacers and the upper guide plate are pushed against each other to push the upper guide plate and the lower guide plate apart from each other.

15. The method of claim 13 further comprising, after the step of spacing the upper guide plate apart from the lower guide plate, laterally shifting the upper guide plate relative to the lower guide plate by a lateral distance.

16. The method of claim 13, wherein the step of inserting the plurality of probe pins is performed until probe pin stoppers attached on the plurality of probe pins are blocked by the upper guide plate.

* * * * *